United States Patent [19]

Badoz et al.

[11] Patent Number: 5,140,381

[45] Date of Patent: Aug. 18, 1992

[54] OPTICAL DETECTION DEVICE WITH VARIABLE DETECTION THRESHOLD

[75] Inventors: Pierre A. Badoz, Grenoble; Jean-Yves Duboz, Dole, both of France

[73] Assignee: France Telecom-Etablissement autonome de droit public(Centre National d'Etudes des Telecommunications), Issy Les Moulineaux, France

[21] Appl. No.: 672,553

[22] Filed: Mar. 20, 1991

[30] Foreign Application Priority Data

Mar. 22, 1990 [FR] France .................. 90 03668

[51] Int. Cl.$^5$ .................. H01L 31/10; H01L 27/14
[52] U.S. Cl. .................. 357/4; 357/15; 357/30
[58] Field of Search .................. 357/4, 16, 30 B, 30 E, 357/30 R, 15

[56] References Cited

U.S. PATENT DOCUMENTS 4,903,101 2/1990 Maserjian .................. 357/30 E
4,908,686 3/1990 Maserjian .................. 357/30

FOREIGN PATENT DOCUMENTS 0007878 2/1980 European Pat. Off. .

OTHER PUBLICATIONS

J. M. Pinti Guedes et al, Journal of the Optical Society of America, "Picosecond Thin-Film Metal-Semiconductor-Metal Photodetectors", vol. 70, No. 6, Jun. 1980, pp. 631, 632.

M. Heiblum et al, IEEE Journal of Quantum Electronics, "Characteristics of Integrated MOM Junctions at DC and AT Optical Frequencies", vol. QE14, No. 3, Mar. 1978, pp. 159-169.

B. M. Ditchek et al, Applied Physics Letters, "Novel High Quantum Efficiency Si-TaSi$_2$ Eutectic Photodiodes", vol. 51, No. 4, Jul. 27, 1987, pp. 267-269.

*Primary Examiner*—James W. Davie
*Attorney, Agent, or Firm*—Oblon, Spivak, McClelland, Maier & Neustadt

[57] ABSTRACT

An optical detection device with a variable detection threshold. The optical detection device comprises at least one element having a heterostructure on a substrate, the heterostructure incorporating two conducting layers and, between the latter, a semiconducting layer forming a potential barrier with each of the conducting layers is provided. Excited electrons are formed when the heterostructure is illuminated by light radiation, whose energy is at least equal to the detection threshold of the heterostructure. This makes it possible to detect the radiation by an internal photoemission of electrons between one conducting layer and the other. The device also comprises variable biasing of the heterostructure, the biasing making it possible to vary the detection spectrum and threshold of the device. The optical detection device finds particular application to the detection of infrared radiation.

19 Claims, 2 Drawing Sheets

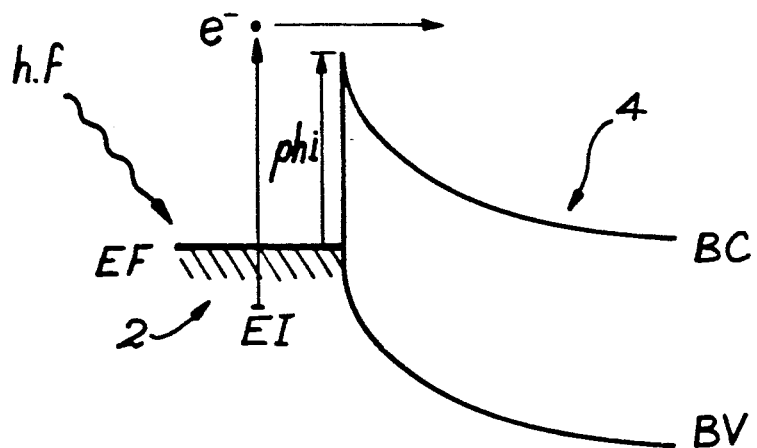
FIG. 1
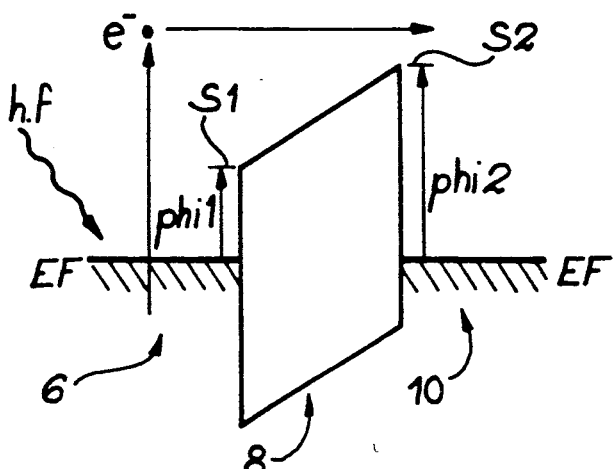
FIG. 2
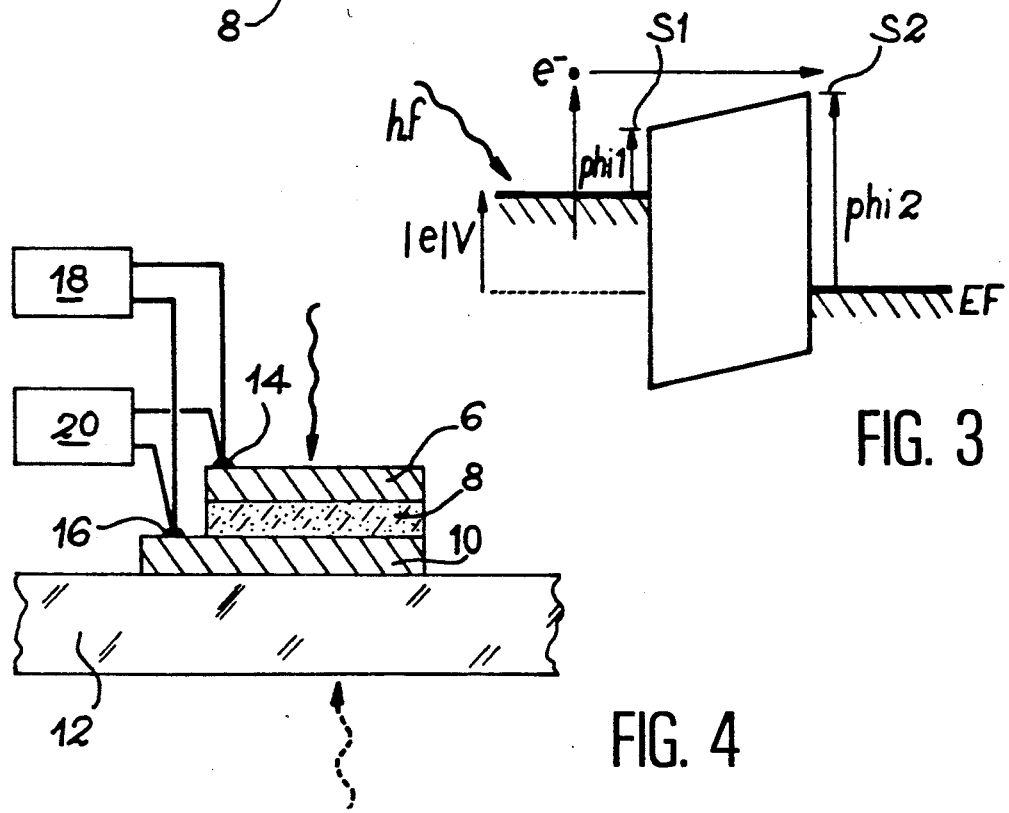
FIG. 3
FIG. 4

OPTICAL DETECTION DEVICE WITH VARIABLE DETECTION THRESHOLD

BACKGROUND OF THE INVENTION

1. Field of the Invention

The present invention relates to an optical detection device. It particularly applies to the detection of infrared radiation.

2. Discussion of the Background

Optical detection devices making it possible to detect light radiation in the near infrared range are already known. Such devices are e.g. referred to in the following documents:

Article by W. F. KOSONOCKY et al, published in Proceedings of the 14th Conference (1982 International) on Solid State Devices, Tokyo, 1982, Japanese Journal of Applied Physics, vol. 22, 1983, Supplement 22-1, pp 103–108.

Article by BOR-YEU TSAUR et al, published by IEEE Electron Device Letters, vol. 9, Nos. 12, December 1988, pp 650–653.

Article by BOR-YEU TSAUR et al, published in IEEE Electron Device Letters, vol. 10, No. 8, August 1989, pp. 361–363.

These known devices are a Schottky diodes comprising a thin metal film with a thickness of approximately 10 nm deposited on a semiconductor substrate.

The principle of optical detection by means of Schottky diode is diagrammatically illustrated by FIG. 1, in which it is possible to see the junction between the metal film 2, whose Fermi level is designated EF, and the semiconductor substrate 4, whose valence band and conduction band are respectively designated BV and BC.

The optical detection principle in this Schottky diode is that the incident light radiation constituted by h.f. energy photons is absorbed by the electrons of the metal film 2, h being the Planck constant and f the frequency of the photons.

When a e⁻ electron has absorbed a photon, it then has an energy equal to the sum of the energy EI which it had prior to the absorption of the photon and the h.f. energy of the photon which it has absorbed. If this sum exceeds the height phi of the potential barrier existing at the interface between the metal film and the semiconductor substrate, the excited electron is liable to clear the potential barrier and can be collected by the semiconductor substrate.

This leads to an internal photoemission of electrons from the metal film to the semiconductor substrate. This internal photoemission causes the passage of a photocurrent, which can then be amplified and detected.

The energy range of the detected radiation is downwardly limited by the height phi of the Schottky barrier of the diode and which is equal to the difference between the bottom of the conduction band BC of the semiconductor substrate and the Fermi level EF of the metal film. This barrier height is determined by the chosen pair (metal, semiconductor).

For example, for type N silicon, the barrier height is approximately 0.3 to 0.95 eV as a function of the metal chosen.

Moreover, the potential barrier height is virtually independent of the voltage applied between the diode terminals, a very small phi variation of a few dozen meV at the most, being obtainable by applying a voltage of a few volts to the diode (Schottky effect).

SUMMARY OF THE INVENTION

Therefore, in practice, the spectrum of the detected radiation and in particular the optical detection threshold (minimum energy or maximum wavelength detected) are fixed for a given diode and cannot be varied.

The present invention aims at obviating these disadvantages by proposing a monolithic optical detection device, whereof it is possible to very significantly vary the detection spectrum (up to a few hundred meV), namely by applying to it a voltage which, in certain particular constructions, does not exceed 1V.

For this purpose, the present invention makes use of a structure of the conductor/semiconductor/conductor type or conductor/insulant/conductor type, e.g. a metal/semiconductor/metal-type structure.

More specifically, the present invention relates to an optical detection device, characterized in that it comprises a substrate and, on the latter, at least one element having a heterostructure, the latter incorporating too electrically conductive layers and, between the latter, an intermediate semiconducting or insulating layer forming a potential barrier with each of the conducting layers, excited electrons being formed when the heterostructure is illuminated by a light radiation, whose energy is at least equal to the detection threshold of the heterostructure, which makes it possible to detect this radiation by internal photoemission of electrons from one conducting layer to the other and in that the device also comprises means for the variable polarization of the heterostructure, the polarization means making it possible to vary the detection spectrum and also the detection threshold of the device.

Each of the two conducting layers can e.g. be a metal layer or an adequately doped semiconducting layer.

Thus, a multispectral optical detection device exists, i.e. a detection device, whose detection spectrum and also detection threshold can be varied (or in other words the cut-off frequency), by applying a variable voltage between two conducting layers.

According to a first embodiment of the device according to the invention, the conducting layers are chosen in such a way that the corresponding potential barrier heights differ from one another. It is then possible to vary the detection threshold of the device by means of a small voltage not exceeding 1V.

Moreover, the detection threshold then varies in a quasi-linear manner with the voltage applied over most of the available spectrum.

In the case of the first embodiment, the substrate can be transparent or at least partly transparent to the radiation. This makes it possible to use the device by so orienting it that the radiation reaches the heterostructure whilst traversing the substrate.

As a variant, the device substrate can be opaque to the radiation. In this case, the device is oriented in such a way that the radiation directly reaches the heterostructure.

According to a second embodiment of the device according to the invention, the conducting layers are chosen in such a way that the potential barrier heights corresponding thereto are substantially equal to one another. In this case, it is also possible to use a substrate which is opaque to the radiation or which is transparent, or partly transparent to the radiation.

In the second embodiment, it is obviously possible to use two conducting layers formed from the same electrically conductive material.

In the device according to the present invention, the substrate can be of silicon. This also makes it possible to produce on the said substrate an electronic control and-/or amplification circuit for the device.

Finally, in a special embodiment of the device according to the invention, the two conducting layers are respectively of erbium disilicide and cobalt disilicide, the intermediate layer being of silicon and the substrate also of silicon.

BRIEF DESCRIPTION OF THE DRAWINGS

The invention is described in greater detail hereinafter relative to non-limitative embodiments and the attached drawings, wherein show:

FIG. 1, already described, the simplified band diagram of a Schottky diode and diagrammatically the internal photoemission of an electron from the metal layer of the diode by absorption of an incident photon.

FIG. 2 The operation of a device according to the invention having an asymmetrical heterostructure, by means of a simplified band diagram of said heterostructure and in the absence of polarization of the device.

FIG. 3 The simplified band diagram of said asymmetrical heterostructure when the device is polarized.

FIG. 4 A diagrammatic view of an optical detection device according to the invention.

DESCRIPTION OF THE PREFERRED EMBODIMENTS

Figure 5:
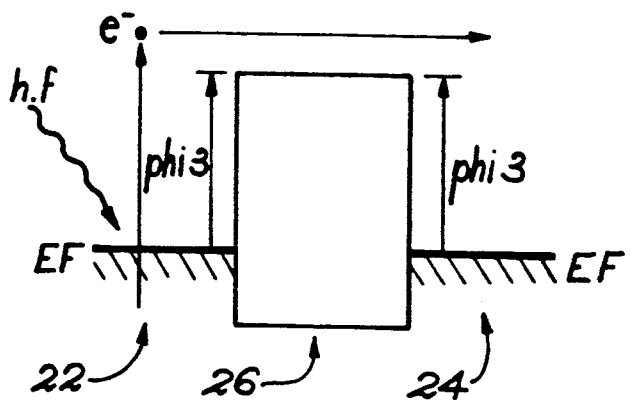
FIG. 5 The operation of another device according to the invention with a symmetrical heterostructure, by means of the simplified band diagram thereof and in the absence of polarization of the device.

In a first embodiment, the device according to the invention comprises an asymmetrical heterostructure formed on a substrate. The substrate can be made from a semiconductor material, but could also be made from an electrically insulating material such as glass.

The asymmetrical heterostructure comprises two electrically conductive thin films or layers between which is placed a thin intermediate, semiconducting or insulating layer.

The conducting layers are made from different electrically conducting materials, so that the intermediate layer respectively forms with the two electrically conducting layers potential barriers of different heights.

The thicknesses of the different layers of the heterostructure are dependent on the materials used for forming these layers and can be a few nanometers to a few hundred nanometers for the two thin conducting layers and a few nanometers to a few hundred nanometers for the thin intermediate layer.

FIGS. 2 and 3 show a simplified band diagram of the asymmetrical heterostructure providing a better understanding of the principle of varying the detection threshold of the device according to the invention, whereof the asymmetrical heterostructure forms part.

The first conductive layer of the asymmetrical heterostructure carries the reference 6 and forms with the intermediate layer 8 a potential barrier of height phi1.

The second conducting layer of the heterostructure carries the reference 10 and forms with the intermediate layer 8 a potential barrier of height phi2.

It is assumed that the constituent materials of the layers 6 and 10 are chosen in such a way that phi1 is less than phi2. Moreover, these materials are so chosen as to be able to investigate with the device having the layers 6, 8 and 10, the desired optical wavelength range.

In the absence of polarization of the device (FIG. 2), i.e. when no voltage is applied between the two conducting layers 6 and 10, the two layers have the same Fermi level, which carries the reference EF in FIGS. 2 and 3.

On exposing the layer 6 to a h.f. energy light radiation, an electron of the layer 6, which is photoexcited by the radiation must clear a trapezoidal potential barrier or more specifically must successively clear the two potential barriers phi1 and phi2 in order to be collected by the conducting layer 10. Thus, in this case the detection threshold is equal to the highest of the two potential barriers, in the present case phi2.

The application of a voltage between the two conducting layers 6 and 10 makes it possible to modify the potential barrier existing between these two conducting layers (FIG. 3).

On taking the conducting layer 10 as the reference, a negative polarization of the layer 6 with respect to the layer 10 leads, in the diagram of FIG. 3, to a displacement of the energy levels towards the top of FIG. 3 and makes it possible to move together the respective upper levels S1 and S2 of the potential barriers phi1 and phi2 and therefore to reduce the optical detection threshold.

In this case, a photoexcited electron from the conducting layer 6 only has to clear a potential barrier whose height is equal to:

$$phi2 - |e| \cdot |V|$$

in which $|e|$ represents the absolute value of the charge of an electron and $|V|$ the absolute value of the voltage applied between the two conducting layers (counting phi1 and ph2 positively).

It can therefore be seen that the photodetection threshold varies linearly with the voltage applied to the device.

The variation of the detection threshold can be very significant and can be several hundred meV and is obtained by applying a low voltage between the two conducting layers, the voltage being equal to the variation of the detection threshold divided by the charge of an electron.

The possibility of using a low voltage for varying the detection threshold makes it possible to greatly limit the leakage current of the device and therefore facilitate the detection of the photocurrent resulting from the arrival of the radiation on the device, which leads to a good signal-to-noise ratio.

For example, it is wished to investigate the radiation range, whose energies vary between 0.3 and 0.65 eV. To this end, use is e.g. made of an intermediate silicon layer and two conducting layers, whereof one is of erbium disilicide, which leads to a 0.3 eV potential barrier compared with the conduction band of the intermediate silicon layer, whilst the other is of cobalt disilicide, which leads to a 0.65 eV potential barrier with respect to the conduction band of the silicon layer.

Thus, without polarization, detection takes place of photons, whose energy is at least equal to 0.65 eV (phi2)

and, by applying an adequate voltage between the two conducting layers, the upper levels S1 and S2 of the potential barriers phi1 and phi2 can be made equal, which makes it possible to detect photons with an energy of at least 0.3 eV (phi1). It is therefore possible to choose the detection threshold between 0.3 and 0.65 eV.

It should be noted that by positively polarizing the layer 6 with respect to the layer 10 taken as the voltage reference, it is possible to increase the upper limit of the investigated range so as to extend beyond 0.65 eV.

FIG. 4 diagrammatically shows a device according to the invention. This device comprises the heterostructure constituted by the layers 6, 8 and 10 and formed on one face of a substrate 12, which is referred to as the upper face.

As a function of the envisaged applications for the device, the device is exposed to the radiation in such a way that the radiation either reaches the upper face of the substrate or the lower face thereof. In the latter case, the substrate must be at least partly transparent in the optical wavelength range which it is wished to study. For example, in the case of infrared radiation, a silicon substrate can be used.

FIG. 4 also shows electrical contacts 14 to 16 respectively placed on the layers 6 and 10 (the conducting layer closest to the substrate projecting over the stack of layers), as well as the means 18 making it possible to apply a variable voltage between the contacts 14 and 16 and therefore between the conducting layers 6 and 10.

It is therefore possible to investigate the desired optical wavelength range by varying the voltage applied between the contacts.

FIG. 4 also shows electronic means 20 for measuring and processing the photocurrent obtained by illuminating the device. These electronic means 20 are also connected to the electric contacts 14 and 16.

Obviously, the thicknesses of the two conducting layers and the semiconducting layer are calculated so as to maximize the absorption and operating efficiency of the device, which applies both for a device having an asymmetrical heterostructure and for a device having a symmetrical heterostructure, which will be considered hereinafter.

Figure 6:
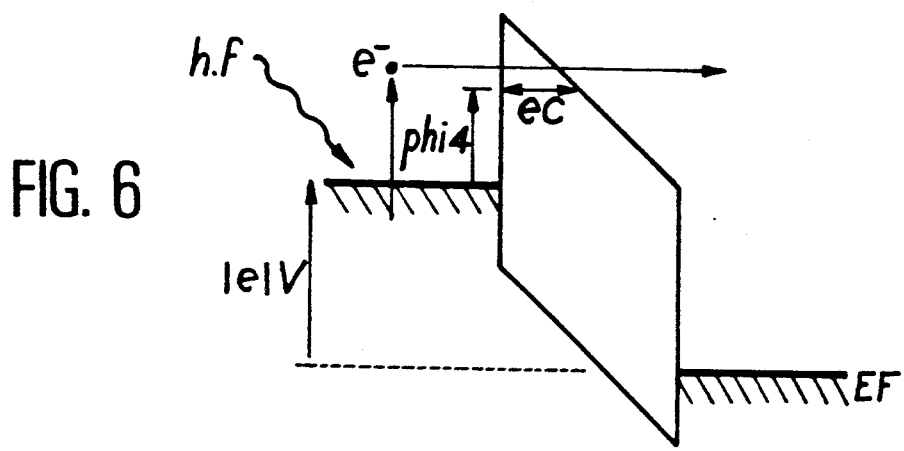
FIG. 6 The simplified band diagram of said symmetrical heterostructure when the device is polarized.

FIGS. 5 and 6 diagrammatically illustrate the principle of another device according to the invention. This device uses a symmetrical and not an asymmetrical heterostructure.

This symmetrical heterostructure comprises two electrically conducting layers 22, 24 between which is located an intermediate, semiconducting or insulating layer 26, the two layers 22 and 24 respectively forming potential barriers of the same height phi3 with the semiconducting layer 26.

FIG. 5 shows that in the absence of electrical polarization of one layer with respect to the other, the detection threshold is equal to phi3.

By negatively and adequately strongly polarizing one of the conductive layers with respect to the other, e.g. layer 22 with respect to layer 24 (which are e.g. made from the same electrically conducting material), FIG. 6 shows that it is possible to significantly reduce the thickness of the potential barrier existing between the layers 22 and 24 in the vicinity of the maximum of the barrier.

Therefore photoexcited electrons, whose energy is not adequate to surmount the potential barrier, will still be able to clear it by the tunnel effect. Consequently the effective height of the potential barrier is lowered, which once again leads to a displacement of the detection threshold.

FIG. 6 shows that the effective height phi4 of the potential barrier and which corresponds to the critical thickness ec of the barrier as from which the tunnel effect becomes no longer negligible, varies as a function of the voltage V applied between the conducting layers 22 and 24.

It should be noted that the probability for an electron clearing a potential barrier by the tunnel effect is a function which is very strongly dependent on the thickness of the barrier and that this probability becomes lower when this thickness exceeds 10 nanometers.

As previously, as a function of the envisaged applications for the symmetrical heterostructure device, its substrate can be transparent or partly transparent or opaque to the studied radiation.

The device of FIGS. 5 and 6 is provided with means (not shown) making it possible to apply a voltage between the conducting layers 22, 24 and to vary the voltage, as well as electronic means (not shown) for measuring and processing the photocurrent obtained by illuminating the device.

It should also be noted that it would be possible to vary the optical conducting threshold of an asymmetrical heterostructure device by using the tunnel effect and by applying adequately high voltages between the two conducting layers of the device to significantly reduce the thickness of the potential barrier between these two layers in the vicinity of the maximum of the barrier.

Details will now be given of the way in which it is possible to produce the device according to the invention. The example of the production process which is given uses ultravacuum growth technologies.

For producing a device according to the invention, e.g. the following procedure is used.

Figure 7:
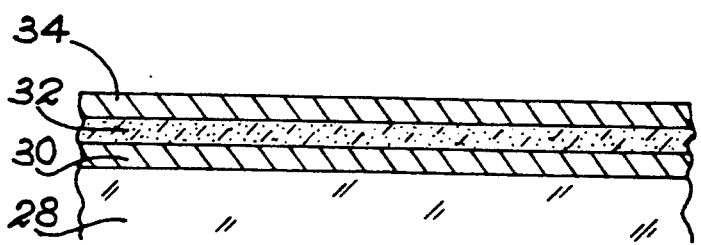
FIGS. 7 to 9 Diagrammatically different stages of a process for the production of a device according to the invention.

1) By epitaxy is formed on a monocrystalline silicon substrate 28 (FIG. 7) a thin erbium disilicide ($ErSi_2$) metal layer by stoichiometric codeposition, followed by recrystallization annealing.

2) On the thin layer 30 is formed by molecular beam epitaxy or by chemical vapour phase deposition a thin silicon semiconducting layer 32.

3) By epitaxy is formed on the layer 32, a thin cobalt disilicide ($CoSi_2$) metal layer 34 by stoichiometric codeposition, followed by crystallization annealing. As a variant, the layer 34 could be platinum, chromium or iridium layer formed by vacuum evaporation.

Figure 8:
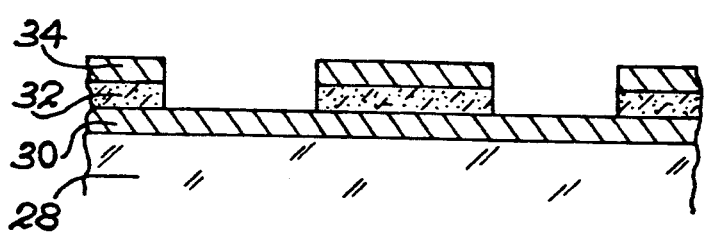

4) The upper metal level of the device is defined by conventional photolithography methods. The layer 34 is etched by a dilute hydrofluoric acid solution and the silicon layer is etched by a dilute potash solution, the $CoSi_2$ layer then serving as a mask. This chemical etching stops at the lower $ErSi_2$ layer, which is not attacked by potash (FIG. 8).

Figure 9:
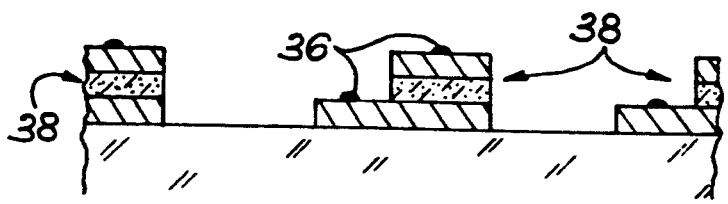

5) The lower metal level of the device is defined by lithography (FIG. 9) and for this purpose the $ErSi_2$ layer is etched by a dilute hydrofluoric acid-based solution. A slight overetching of the silicon of the substrate 28 can be obtained by etching in a dilute potash solution.

6) Electric contacts 36 are formed on each metal layer of each device 38 defined by lithography in the manner described hereinbefore. These electric contacts are e.g. formed by thermocompression welding and not only make it possible to variably polarize by means (not shown) each device 38, but also to detect the photocurrent produced by each of these devices. In this way asymmetrical heterostructure devices are obtained.

In order to form symmetrical heterostructure devices, it would be sufficient for layers 30 and 34 to be identical.

It should be noted that the production of detection devices 38 on a silicon substrate makes it possible to produce on the same substrate electronic control circuits for the devices 38 and/or electronic amplification circuits for the photocurrents produced by these devices 38.

Moreover, as a function of the envisaged applications, the devices 38 obtained can be separated from one another by conventional processes or, on the contrary, will not be separated if it is wished to use an array of detection devices.

In the preceding example, it is possible to replace one or both metal layers of the heterostructure by one or two sufficiently doped semiconducting layers, e.g. an alloy of silicon and germanium highly doped with boron.

The present invention e.g. makes it possible to produce a camera able to operate at different wavelengths, whereas in the prior art it was necessary to have the same number of cameras or filters as wavelengths to be studied.

We claim:

1. Optical detection device, characterized in that it comprises a substrate (12, 28) and, on the latter, at least one element (38) having a heterostructure, the latter incorporating two electrically conductive layers (6-10, 22-24, 30-24) and, between the latter, an intermediate semiconducting or insulating layer (8, 26, 32) forming a potential barrier with each of the conducting layers, excited electrons being formed when the heterostructure is illuminated by a light radiation, whose energy is at least equal to the detection threshold of the heterostructure, which makes it possible to detect this radiation by internal photoemission of electrons from one conducting layer to the other and in that the device also comprises means (18) for the variable biasing of the heterostructure, said biasing means making it possible to vary the detection spectrum and also the detection threshold of the device, said conductive layers being respectively provided with electrical contacts for detecting the internal photoemission of electrons obtained by illuminating the heterostructure.

2. Device according to claim 1, characterized in that the conducting layers (6-10) are chosen in such a way that the heights of the corresponding potential barriers differ from one another.

3. Device according to claim 2, characterized in that the substrate (12) is opaque to the radiation.

4. Device according to claim 2, characterized in that the substrate (28) is at least partly transparent to the radiation.

5. Device according to claim 1, characterized in that the conducting layers (22, 24) are chosen in such a way that the heights of the corresponding potential barriers are substantially equal to one another.

6. Device according to claim 5, characterized in that the substrate (12) is opaque to the radiation.

7. Device according to claim 5, characterized in that the substrate (28) is at least partly transparent to the radiation.

8. Device according to claim 1, characterized in that the substrate (28) is of silicon.

9. Device according to claim 1, characterized in that the two conducting layers (30, 34) are respectively of erbium disilicide and cobalt disilicide, that the intermediate layer (32) is of silicon and that the substrate (28) is also of silicon.

10. An optical detection device, comprising:
a substrate;
at least one element having a heterostructure formed on the substrate, incorporating two electrically conductive layers;
an intermediate semiconductor or insulating layer formed between the two electrically conductive layers forming a potential barrier with each of the electrically conducting layers, wherein excited electrons are generated when the heterostructure is illuminated by a light radiation, whose energy is at least equal to the detection threshold of the heterostructure, thereby making it possible to detect this radiation by an internal photoemission of electrons from one conducting layer to the other;
voltage applying means for applying a voltage to the heterostructure, said applied voltage making it possible to vary the detection spectrum and also the detection threshold of the device; and
electrical contacts respectively connected to the electrically conductive layers for detecting the internal photoemission of electrons obtained by illuminating the heterostructure.

11. The optical detection device according to claim 10, wherein the conducting layers are chosen in such a way that the heights of the corresponding potential barriers differ from one another.

12. The optical detection device according to claim 11, wherein the substrate is opaque to the light radiation.

13. The optical detection device according to claim 11, wherein the substrate is at least partly transparent to the light radiation.

14. The optical detection device according to claim 10, wherein the conducting layers are chosen in such a way that the heights of the corresponding potential barriers are substantially equal to one another.

15. The optical detection device according to claim 14, wherein the substrate is opaque to the light radiation.

16. The optical detection device according to claim 14, wherein the substrate is at least partly transparent to the radiation.

17. The optical detection device according to claim 10, wherein the substrate is of silicon.

18. The optical detection device according to claim 10, wherein the two conducting layers are respectively of erbium disilicide and cobalt disilicide, and the intermediate layer is of silicon and the substrate is also of silicon.

19. An optical detection process for a device having a substrate, at least one element having a heterostructure formed on the substrate, incorporating two electrically conducting layers, and a semiconducting or insulating layer forming a potential barrier with each of the conducting layers, comprising the steps of:
generating excited electrons by illuminating the heterostructure with light radiation, whose energy is at least equal to the detection threshold of the heterostructure, which makes it possible to detect said radiation by an internal photoemission of the electrons from one conducting layer to the other; and
variably biasing the heterostructure so as to vary the detection spectrum and also the detection threshold of the device, wherein said conductive layers are respectively provided with electrical contacts for detecting the internal photoemission of electrons obtained by illuminating the heterostructure.

* * * * *